(12) United States Patent
Magić

(10) Patent No.: US 11,382,197 B2
(45) Date of Patent: Jul. 5, 2022

(54) SEQUENTIAL MEASUREMENT OF STATUS OF LED LIGHTING AND OTHER APPARATUS CONNECTED TO AN ELECTRICAL POWER LINE AND DISPLAY OF THE STATUS AND THE EXACT GPS POSITION THEREOF

(71) Applicant: Zvonko Magić, Varaždin (HR)

(72) Inventor: Zvonko Magić, Varaždin (HR)

(*) Notice: Subject to any disclaimer, the term of this patent is extended or adjusted under 35 U.S.C. 154(b) by 0 days.

(21) Appl. No.: 17/312,181

(22) PCT Filed: Dec. 10, 2018

(86) PCT No.: PCT/HR2018/000022
§ 371 (c)(1),
(2) Date: Jun. 9, 2021

(87) PCT Pub. No.: WO2020/121002
PCT Pub. Date: Jun. 18, 2020

(65) Prior Publication Data
US 2022/0070985 A1      Mar. 3, 2022

(51) Int. Cl.
*H05B 45/50*      (2022.01)
*H05B 47/155*      (2020.01)
*G01R 31/44*      (2020.01)

(52) U.S. Cl.
CPC .......... *H05B 45/50* (2020.01); *G01R 31/44* (2013.01); *H05B 47/155* (2020.01)

(58) Field of Classification Search
None
See application file for complete search history.

(56) References Cited

U.S. PATENT DOCUMENTS

| 2016/0302276 A1* | 10/2016 | Fushimi | H05B 47/16 |
| 2017/0184659 A1* | 6/2017 | Jayawardena | H05B 47/105 |
| 2018/0116033 A1* | 4/2018 | Mohan | G01R 31/44 |

FOREIGN PATENT DOCUMENTS

| EP | 0048192 A1 | 3/1982 | |
| ES | 2752730 A1 * | 4/2020 | H05B 41/38 |
| FR | 2893197 A1 | 5/2007 | |
| FR | 2918837 A1 | 1/2009 | |
| FR | 2993427 A1 | 1/2014 | |

* cited by examiner

*Primary Examiner* — Anh Q Tran
(74) *Attorney, Agent, or Firm* — Kriegsman & Kriegsman

(57) ABSTRACT

Simple, reliable and inexpensive application-wise system for obtaining information on the status of apparatus connected to a "lighting power line." System of obtaining information is completely immune to disturbances since nothing additional is introduced into the grid. Information is detected in a substation or an electric lighting enclosure i.e. at the power supply source in standard classical measurement methods. During the activation of LED lighting fixtures on each power line, power-time curves or current-time curves are measured and recorded for the corresponding energy power line, and from them a start diagram is derived after activating all lighting fixtures on that particular power line, and this diagram is used for comparing the status on each individual power line, and then the derived start diagram is compared with the initial diagram of the power-time curve or current-time curve for the corresponding power line.

18 Claims, 3 Drawing Sheets

| 0 | Start | - | - |
|---|---|---|---|
| 1 | Start POWER | 36,56 | 36,56 |
| 3 ON | LED 1 | 11,84 | 48,40 |
| 5 ON | LED 2 | 11,64 | 60,04 |
| 7 ON | LED 3 | 12,12 | 72,16 |
| 9 ON | LED 4 | 11,78 | 83,94 |
| 11 ON | LED 5 | 11,20 | 95,14 |
| 13 ON | LED 6 | 11,52 | 106,66 |
| 15 ON | LED 7 | 11,82 | 118,48 |
| 17 ON | LED 8 | 11,48 | 129,96 |
| 19 ON | LED 9 | 12,22 | 142,18 |
| 21 ON | LED 10 | 11,72 | 153,90 |
| 23 | Line POWER | | 153,90 |

| 0 | Start | - | - |
|---|---|---|---|
| 1 | Start POWER | 25,58 | 25,58 |
| 3 OFF | LED 1 | 0,84 | 26,42 |
| 5 ON | LED 2 | 11,84 | 38,26 |
| 7 ON | LED 3 | 11,74 | 50,00 |
| 9 ON | LED 4 | 11,86 | 61,86 |
| 11 ON | LED 5 | 11,44 | 73,30 |
| 13 OFF | LED 6 | 0,06 | 73,36 |
| 15 ON | LED 7 | 11,66 | 85,02 |
| 17 OFF | LED 8 | - 0,16 | 84,86 |
| 19 ON | LED 9 | 11,62 | 96,48 |
| 21 ON | LED 10 | 11,86 | 108,34 |
| 23 | Line POWER | | 108,34 |

SEQUENTIAL MEASUREMENT OF STATUS OF LED LIGHTING AND OTHER APPARATUS CONNECTED TO AN ELECTRICAL POWER LINE AND DISPLAY OF THE STATUS AND THE EXACT GPS POSITION THEREOF

FIELD OF THE INVENTION

The subject invention relates to the process of measuring electrical parameters of a grid (power or current) on an electrical power line for lighting, using the process of sequential activation of energy-consuming apparatus. The process is intended for use with lighting systems whereby it is possible to easily determine the exact position of non-operational apparatus or apparatus that are not operating according to expected parameters by applying the process according to this invention. According to the International Patent Classification, the subject invention is classified in class G01R—Measuring electric variables, and specifically in subclass G01R 22/00—Arrangements for measuring time integral of electric power or current.

TECHNICAL PROBLEM

The very rapid transition from classical lighting to LED lighting has enabled greater energy conservation and has also changed the requirements involving the management and supervision of lighting and other devices on "electrical power lines for lighting" (street lighting, industrial lighting and lighting in general). After a few years of use and with the reduction of product costs, it has become clear that the greater part of the system's intelligence lies in the power supply itself. Power supplies are programmable by power and time (various timer operation modes). Each LED lighting fixture is individually adjusted according to an exact calculation and is time-programmed. During the period of operation (whether at night—street lighting or industrial—human presence or absence) the lighting itself is highly efficient (low consumption) and the power is additionally lowered according to a program or sensor (human presence, lux meter, etc.) and consumes an optimally low amount of energy. Each instance of remote control, for the purpose of reducing consumption, is no longer economical. Installing additional electronic devices in each lamp for the purpose of conservation and supervision is so expensive that the return on such an investment always occurs after the product's lifetime. The simple installation of additional electronic devices in each lamp is not cost-effective and represents a waste of money. Therefore, only the question of supervision of the entire lighting system remains, which involves the compilation of total data for each individual lighting fixture. To determine the status of an individual lighting fixture within a municipal lighting system, the following information is necessary: whether the lighting fixture is operational, whether the lighting fixture is operating at the anticipated power, and if a lighting fixture is defective, the type of lighting fixture and its position (geographic GPS position or another position) must be determined. The same applies to remaining apparatus on the same power supply line (advertisements, Christmas lighting and other energy-consuming apparatus).

Based on such information, a report is ultimately acquired on the individual state of each lamp or apparatus, the total consumption of the line being powered, the total consumption of all power lines from an electrical substation, the total consumption of all substations that provide a power supply to the lighting system and the total consumption of a city or neighbourhood. When deviations from the expected arise, the system automatically signals at which points the mentioned deviations have been detected. Information on the exact position of the deviation (malfunction) automatically initiates the extraction of necessary parameters and repair instructions from a database.

The subject problem is inexpensively and simply resolved by applying the system of sequential activation and measurement of operational parameters of LED lighting and other apparatus connected to a power line, which is to be described below.

PRIOR ART

Among many outdated systems such as network ripple control, which is not suitable for LED lighting, systems using GSM, Wi-Fi, network modulation, optics, etc. have emerged. All of these systems call for separate electronics in each lighting fixture. Each set of electronics has its purchase and maintenance costs, which must be profitable as a result of the conservation achieved with LED lighting. From the stated existing systems, no profitability exists, as the potential conservation resulting from a programmed LED lighting fixture is negligible. If LED lighting with the average power of approximately 30 W additionally conserves approximately 15% with direct additional commands at night, then the power is 4.5 W. As an example, conservation of 4.5 W per year (during 4200 operating hours) is 18.9 kWh of energy, which is the equivalent of approximately 2.5 €. However, no communication system exists that could be implemented directly onto a LED lighting fixture and that could be amortized with the stated amount of 2.5 € per year. Especially if this includes other telephony costs as well as electronics and logistics that are not included in the price of the lighting fixture, then this is unjustifiably expensive and not cost-effective.

DISCLOSURE OF THE INVENTION

The measurement system, which is the subject of this invention, basically has an intelligent LED drive in the electronics of its power supply, specifically on the side containing the LED lighting, that is programmed beforehand for sequential activation, and the measuring itself is performed in a central substation (or in electrical enclosures) on the power supply lines. Power meter devices and the grid analyser in the substation or electrical enclosure are simply added to existing transmission systems (M-Bus and similar) and the obtained information can be sent to a server.

The process of sequential measuring operational parameters of LED lighting and other apparatus on a lighting power line comprising an electric lighting enclosure in which lighting energy lines are situated, and which are connected to a meter device installed in the electric lighting enclosure, and where on each of the sequentially arranged lighting energy lines, a large number of LED lighting fixtures are connected whereby each LED lighting fixture contains a power supply within the electronics inside the LED lighting fixture, and the process includes a "zero-point" measuring of power or current after the grid's stabilization period, followed by the sequential activation of all lighting fixtures at full power on each individual power line, by way of a power supply that is programmed beforehand for time-delayed activation of each LED lighting fixture. During the activation of LED lighting fixtures on an individual power line, measurements and recordings of power-time curves or current-time curves are conducted for the corresponding power line, from which, upon activation of all lighting fixtures on that power line, a start diagram ($P_{start}$) is derived in order to compare the status on each individual power line, and then the derived start diagram ($P_{start}$) is compared with the initial diagram ($P_i$) of the power-time curve or current-time curve for the corresponding energy line. When comparing the start diagram ($P_{start}$) with the initial diagram, and if deviations are present on-site or if there are locations where deviations are present, the system signals such errors in the operation of a corresponding LED lighting fixture.

Delayed power output for LED lighting or apparatus can generally be adjusted in two ways 1. By programming the power supply or electronics during the manufacturing process (or exploitation) to adjust the time-delayed power of electricity beforehand. When turned on, all apparatus start in STBY mode or operate at a specific percentage of power e.g. 30% and then power sequentially rises to the programmed value of e.g. 100%
2. With timed electronics or a timed relay, which activates the apparatus or control mechanism with a delay (0-10V, PWM, processor input, etc.)

With the stated delayed activation of LED lighting fixtures (the desired delay for each lighting fixture on one power line is approximately up to 2 seconds), it is possible to determine at which locations in the diagram (power-time activation or current-time activation) deviations occur that signal an error in the operation of a LED lighting fixture by recording the initial power consumption diagram during activation and by subsequent comparison of the operational state of a corresponding power line.

BRIEF DESCRIPTION OF FIGURES

The figures provided herein, which are included in the description and comprise a portion of the invention's description, show the most preferable embodiment of the invention, and assist in explaining the basic principles of the invention. Below are the figures, an explanation of the current art and of the subject invention, in order to easier understand the differences.

EMBODIMENT OF THE INVENTION

Figure 1:
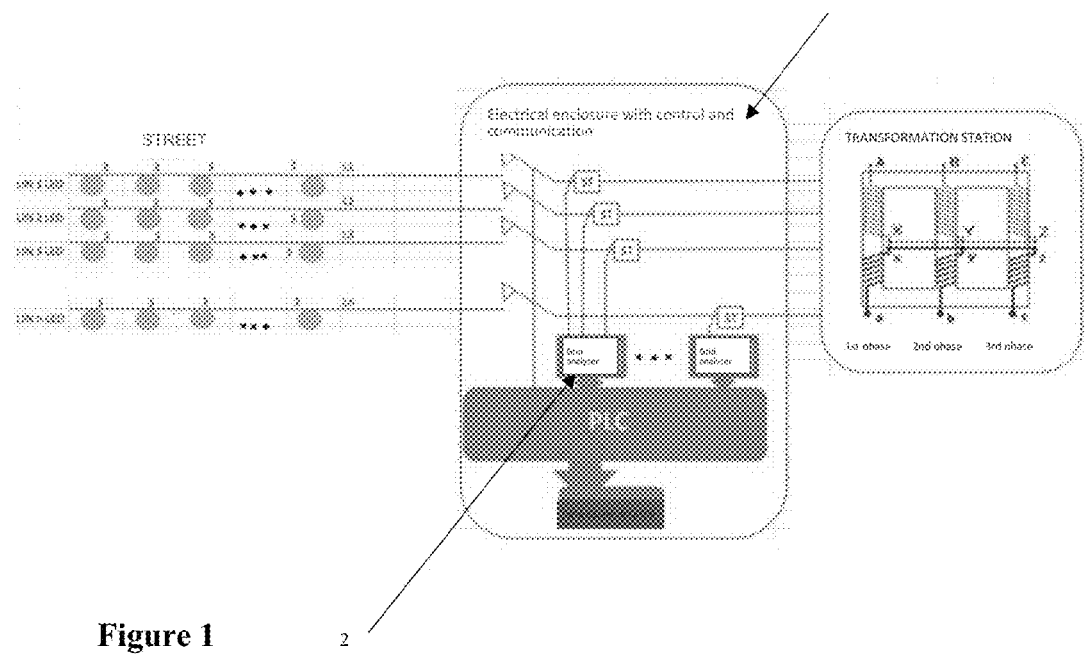
FIG. 1—shows the schematic representation of the sequential measurement of operational parameters of LED lighting and other apparatus connected to a power line FIG. 2—shows the general representation of the power-time curve or current-time curve that shows the invention's principles of operation FIG. 3—shows a test example of the sequential measurement of operational parameters of LED lighting with 10 lighting fixtures in the case where all lighting fixtures are activated and no errors are present in the operation of the lighting fixtures FIG. 4—shows a test example of the sequential measurement of operational parameters of LED lighting with 10 lighting fixtures in the case where all lighting fixtures are activated and the lighting fixtures LED1, LED 6 and LED 8 are not activated, i.e. operating erroneously FIG. 5—shows the start diagram ($P_{start}$) of the power-time curve or current-time curve in the case according to FIG. 2 without errors in operation, and start diagram ($P_{start}$) of the power-time curve or current-time curve in the case according to FIG. 3 where lighting fixtures LED1, LED 6 and LED 8 are non-operational. The time diagram shows the sequential and synchronized activation of apparatus and measurement in the supply portion of the power line. The activation time, relevant for the detection of an apparatus, and the height of the steps, relevant for determining the power of individual apparatus, can be read simultaneously.
Figure 2:
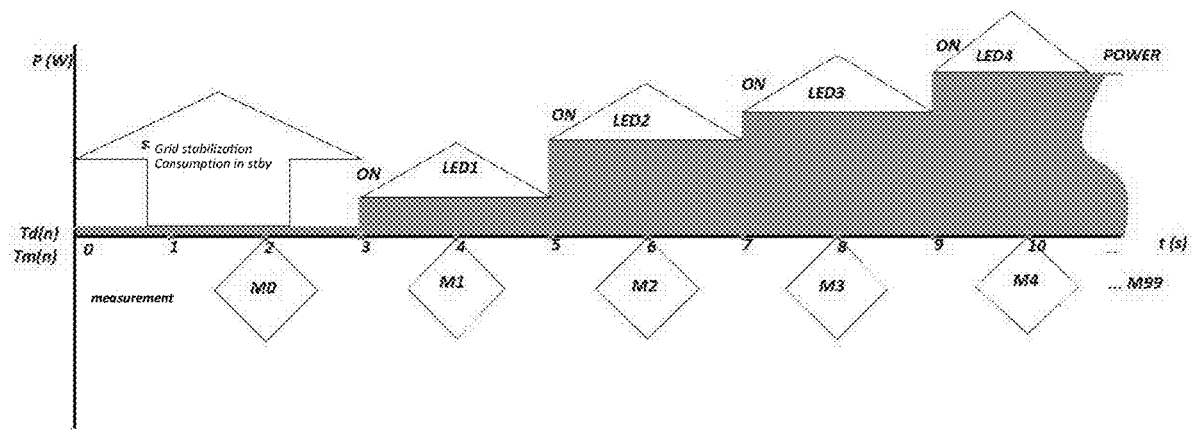
Figure 3:
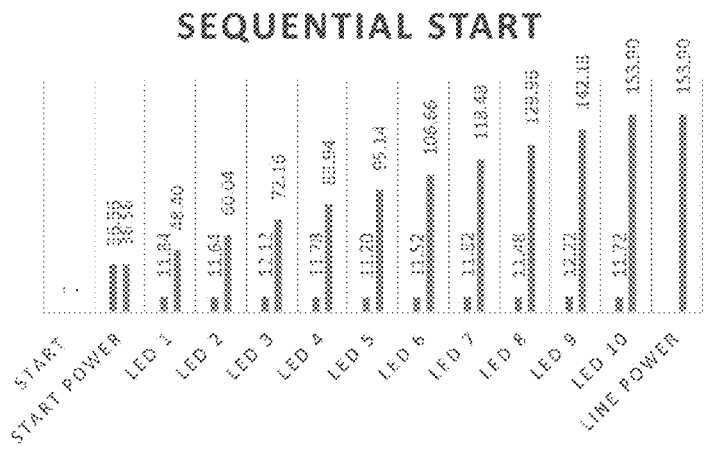
Figure 4:
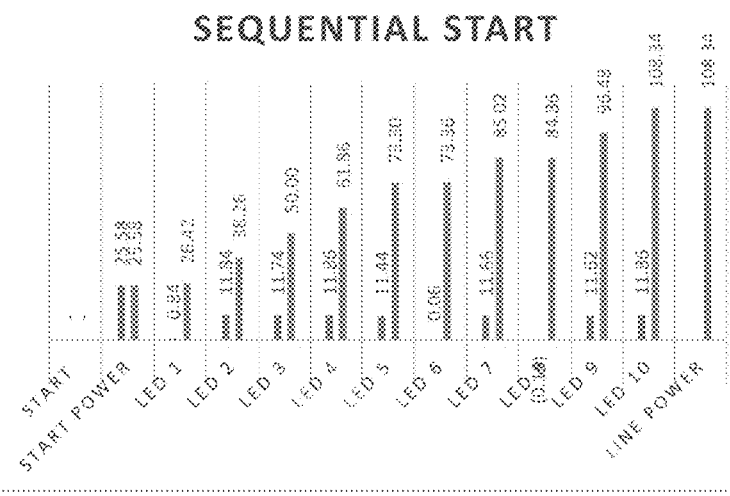
Figure 5:
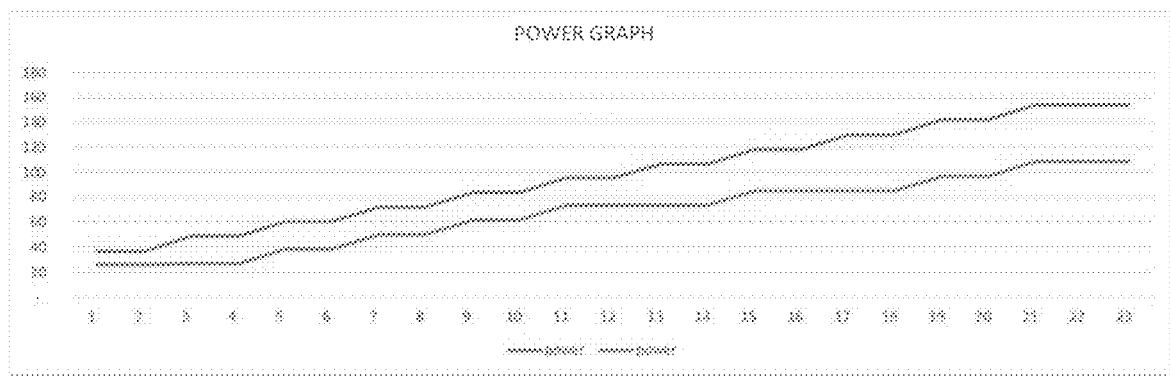

The process for the sequential measurement of operational parameters of LED lighting and other apparatus connected to a power line comprising an electric lighting enclosure (1) in which all energy power lines ($L_1$, $L_2$, $L_3$ ..., $L_n$) are located, whereby the stated energy power lines are also connected to a meter device (2) installed in the electric lighting enclosure (1) by which the desired readouts are conducted, and where a larger number of LED lighting fixtures (3) are connected to each sequentially-arranged energy power line, whereby each LED lighting fixture (3) includes a power supply (PS) as part of the electronics within the LED lighting fixture (3). The first two seconds serve to stabilize the grid to eliminate inrush current and other grid instabilities. After this, the starting of serial measurement follows along with the activation of apparatus (LED lighting). Measurements are taken between two ignitions upon stabilization. At this point, the grid is stable again and without oscillations and easily readable. Thus a multi-step-shaped power curve results from taking measurements (beginning of the power line in the substation). The first step is the consumption of all activated apparatus without delay (STBY mode of operation+30% starting power+apparatus without delay). Each following step is the power of the sequentially delayed apparatus (LED module of apparatus with delay) up to 100% power of apparatus). All time periods can be reduced or increased depending on the quality of the apparatus, grid oscillations and grid analyzers.

The stated process of sequential measurement comprises the following steps:

a) A "zero-point" measurement of power or current after the grid's stabilization period of approximately 2 seconds, and in the mentioned state of the grid, the consumption of an apparatus that is not connected sequentially but immediately (e.g. various decorations, advertisements) and initial/starting consumption of the power supply (PS) of each LED lighting fixture (3) are included, b) Sequential activation of all lighting fixtures (3) at full power at each individual power line ($L_1$, $L_2$, $L_3$ ..., $L_n$), by the stated power supply (PS), which is programmed in advance for time-delayed activation of each individual LED lighting fixture (3).

c) During the sequential activation of each LED lighting fixture (3) on each power line ($L_1$, $L_2$, $L_3$ ..., $L_n$), and after activation of each individual LED lighting fixture (3), power-time curves or current-time curves are measured and recorded for the corresponding energy power line ($L_1$, $L_2$, $L_3$ ..., $L_n$), and from them a start diagram ($P_{start}$) is derived after activating all lighting fixtures (3) on that particular power line, and this diagram is used for comparing the consumption status on each individual power line ($L_1$, $L_2$, $L_3$ ..., $L_n$), d) After activation of all LED lighting fixtures (3) on each power line ($L_1$, $L_2$, $L_3$ ..., $L_n$), the start diagram ($P_{start}$) of the power-time curve or current-time curve of each power line ($L_1$, $L_2$, $L_3$ ..., $L_n$) is compared with the initial diagram of the power-time curve or current-time curve for a corresponding energy power line.

e) If deviations are found upon comparing the start diagram ($P_{start}$) of the power-time curve or current-time curve in respect to the initial diagram ($P_i$) of the power-time curve or current-time curve, errors in operation of the corresponding LED lighting fixture (3) are signalled at the location or locations where there are deviations between the start diagram ($P_{start}$) of the power-time curve or current-time curve in respect to the initial diagram ($P_i$).

All measurements relevant to the process are performed in the electric lighting enclosure (1) by a meter device (2), which is configured to record the power and current of each individual LED lighting fixture (3) the moment after stable operational parameters of each individual LED lighting fixture (3) is achieved, preferably 1 to 2 seconds after activation. Such a system of acquiring information is completely immune to disturbances since nothing additional is introduced into the grid. Information is detected in a substation or an electric lighting enclosure i.e. at the power supply source in standard classical measurement methods. The measurement process does not in any way affect the operation of the grid itself. A grid analyser is coupled with a PLC device, and the PLC has an output for various methods of data transmission (M-bus, GSM).

Recording each start diagram ($P_{start}$) of a power-time curve or current-time curve for a corresponding power line is conducted only during the process of activating individual power lines ($L_1, L_2, L_3 \ldots, L_n$).

Recording the initial diagram ($P_i$) of a power-time curve or current-time curve for each individual power line ($L_1, L_2, L_3 \ldots, L_n$) is achieved with the first activation of operation. Alternatively, the project diagram ($P_{proj}$) of the power-time curve or current-time curve for a corresponding power line ($L_1, L_2, L_3 \ldots, L_n$) can be used.

The appearance of the initial diagram ($P_i$) of the power-time curve or current-time can change depending on newly connected apparatus on a corresponding power line ($L_1, L_2, L_3 \ldots, L_n$). During the first next activation of a corresponding power line ($L_1, L_2, L_3 \ldots, L_n$), a new initial diagram ($P_i$) of the power-time curve or current-time curve is recorded for each individual power line that received an addition of new apparatus, whereby from that moment, the newly recorded diagram is used as the initial diagram ($P_i$) for comparison with the start diagram ($P_{start}$) of the power-time curve or current-time curve.

The initial/starting consumption of the power supply (PS) of each LED lighting fixture can be adjusted from 0 to 90% of the total power supply (PS), preferably in the range 10-50%, while the remainder of the total power supply (PS) is used for the complete activation of the sequential measurement of the status of lighting fixtures (3) on an individual power line ($L_1, L_2, L_3 \ldots, L_n$).

When all precise measurements are obtained for each detected apparatus, and for power and activation time, the exact GPS coordinates are then determined, which also extract all other relevant data from a database. Each individual power line ($L_1, L_2, L_3 \ldots, L_n$) with an exact position of each LED light fixture (3) on that line is paired with a corresponding geographic position and based on the readout of the moment of activation of an individual LED lighting fixture (3) for which a deviation was registered on a corresponding power line ($L_1, L_2, L_3 \ldots, L_n$), it is possible to acquire the exact geographic location of a lighting fixture (3) that signals a deviation/error in operation. The identification code for the GPS coordinates consist of three elements. The first part of the code is the apparatus (lamp) number determined by a time-delay sequence. This is also a location on the connecting power line. The second part of the code is a measuring probe on the line and the third part of the code is the measuring computer in the substation that provides information on the group of power lines it covers (neighbourhood).

The example: apparatus 009 probe 03 computer 03—009-03-06, this number contains GPS coordinates in a database and is the database carrier concerning the current state of that lighting fixture. All other reports are products of the database and algorithms. Reports can be from individual apparatus up to complete "cities" or "supervised areas."

During the first activation upon construction of the system, it is possible to record the start diagram ($P_{start}$) of the power-time curve or current-time curve for a corresponding power line start, and conduct its comparison with the project diagram ($P_{proj}$) of the power-time curve or current-time curve for a corresponding power line ($L_1, L_2, L_3 \ldots, L_n$) in order to determine whether all apparatus have been correctly installed on the corresponding power line ($L_1, L_2, L_3 \ldots, L_n$).

The status and exact GPS position are sent to a server and web portal where the user has all necessary information for supervision, management, maintenance and exploitation of the system. The preferred system according to the invention is able to offer the possibility of control and give the user the following information:

Supervision and control of a city's complete lighting system

Supervision and control of each individual lighting fixture with data:
  1. Whether it is activated (working)
  2. Amount of consumption—power
  3. If not operating properly, whether it has ceased operation (defective) or operating with less power Supervision and consumption of each individual power line
  1. Whether it is activated
  2. Whether the anticipated power is consumed
  3. Constant supervision of power in order to control operation during night mode
  4. Constant supervision due to possible anomalies (automobile impact, lightning strikes, unauthorized connections—electricity theft)
  5. Special supervision of temporarily authorized lighting (Christmas and similar occasions)

Supervision and consumption of all power lines from one substation neighbourhood supervision
  1. Whether all lines are activated
  2. Whether they consume the anticipated power
  3. The possibility of remotely activating and deactivating any line of the substation
  4. The possibility of connecting to a lux meter
  5. The possibility of connecting to any type of control owned by the client (ripple control, M-Bus, etc.)

Supervision and consumption of all lighting substations—entire city
  1. Whether a "City" consumes the exact anticipated amount of energy
  2. Whether a "City" operates correctly according to an anticipated conservation program The system can offer general cumulative and individual reports to the client as follows:
  1. Energy consumption data during a period, total and individual, as requested by the user (if various rates, etc. exist)

2. Alarms:
   Messaging on malfunctions of certain lighting fixtures with all necessary data from the database
   Messaging on malfunctions on a certain line
   Messaging on malfunctions of a substation
   Messaging on malfunctions of the system
3. Other data and statistical reports from the database (types of lighting fixtures specified at each lighting location, location description, utility pole description, fixture descriptions, reception description, maintenance description, description of previous interventions—malfunctions, contacts with lighting maintenance company, names, telephone numbers, and other useful information such as the connection with the geographic map i.e. the exact position on a map

APPLICATION OF THE INVENTION

The subject invention is intended for use with public lighting systems and for industrial and building lighting. Persons skilled in the art will find it obvious that numerous modifications and changes could be made to the described process according to this invention, without abandoning the scope and essence of the invention.

The invention claimed is:

1. The process of sequential measurement of operational parameters of LED lighting and other apparatus connected to a power line comprising an electric lighting enclosure in which all energy power lines are located, whereby the stated energy power lines are also connected to a meter device installed in the electric lighting enclosure by which the desired readouts are conducted, and where a greater number of LED lighting fixtures are connected to each sequentially-arranged energy power line, whereby each LED lighting fixture includes a power supply as part of the electronics within the LED lighting fixture is characterized in that the process consists of the following steps:
   a) a "zero-point" measurement of power or current after a stabilization period of the grid of approximately 2 seconds, in the mentioned state of the grid, the consumption of an apparatus that is not connected sequentially but immediately (e.g. various decorations, advertisements) and initial/starting consumption of the power supply of each LED lighting fixture,
   b) sequential activation of all lighting fixtures at full power at each individual power line, by the stated power supply, which is programmed in advance for time-delayed activation of each individual LED lighting fixture,
   c) during sequential activation of each LED lighting fixtures on each power line, and after activation of each individual LED lighting fixture, power-time curve or current-time curves are measured and recorded for the corresponding energy power line, and from them a start diagram is derived after activating all lighting fixtures on that particular power line, and this diagram is used for comparing the consumption status on each individual power line,
   d) after activation of all LED lighting fixtures on each power line, the start diagram of the power-time curve or current-time curve of each power line is compared with the initial diagram of the power-time curve or current-time curve for a corresponding energy power line,
   e) if deviations are found upon comparing the start diagram of the power-time curve or current-time curve in respect to the initial diagram of the power-time curve or current-time curve, errors in operation of the corresponding LED lighting fixture are signalled at the location or locations where there are deviations between the start diagram of the power-time curve or current-time curve in respect to the initial diagram.

2. The process of sequential measurement of operational parameters of LED lighting according to claim 1 characterized in that measurements are conducted in the electric lighting enclosure by a meter device, which is configured to record the power or current of each individual LED lighting fixture the moment after stable operational parameters of each individual LED lighting fixture is achieved, preferably 1 to 2 seconds after activation.

3. The process of sequential measurement of operational parameters of LED lighting according to claim 1 characterized in that the recording of each start diagram of a power-time curve or current-time curve for a corresponding power line is conducted only during the process of activating individual power lines.

4. The process of sequential measurement of operational parameters of LED lighting according to claim 1 characterized in that the recording of the initial diagram of a power-time curve or current-time curve for each individual power line is achieved with the first activation of operation or alternatively, the project diagram of the power-time curve or current-time curve for a corresponding power line can be used.

5. The process of sequential measurement of operational parameters of LED lighting according to claim 1 characterized in that the appearance of the initial diagram of the power-time curve or current-time curve can change depending on newly connected apparatus on a corresponding power line and during the first next activation of a corresponding power line, a new initial diagram of the power-time curve or current-time curve is recorded for each individual power line that received an addition of new apparatus, whereby from that moment, the newly recorded diagram is used as the initial diagram for comparison with the start diagram of the power-time curve or current-time curve.

6. The process of sequential measurement of operational parameters of LED lighting according to claim 1 characterized in that the initial/starting consumption of the power supply of each LED lighting fixture can be adjusted from 0 to 90% of the total power supply, preferably in the range 10-50%, while the remainder of the total power supply is used for the complete activation of the sequential measurement of the status of lighting fixtures on an individual power line.

7. The process of sequential measurement of operational parameters of LED lighting according to claim 1 characterized in that each individual power line with an exact position of each LED light fixture on that line is paired with a corresponding geographic position and based on the readout of the moment of activation of an individual LED lighting fixture for which a deviation was registered on a corresponding power line, it is possible to acquire the exact geographic location of a lighting fixture that signals a deviation/error in operation.

8. The process of sequential measurement of operational parameters of LED lighting according to claim 1 characterized in that during the first activation upon construction of the system, it is possible to record the start diagram of the power-time curve or current-time curve for a corresponding power line and conduct its comparison with the project diagram of the power-time curve or current-time curve for a corresponding power line in order to determine whether all apparatus have been correctly installed on the corresponding power line.

9. The process of sequential measurement of operational parameters of LED lighting according to claim 3 characterized in that the status and exact GPS position are sent to a server and web portal where the user has all necessary information for supervision, management, maintenance and exploitation.

10. Public lighting systems or industrial and building lighting that use LED lighting fixtures are characterized in that they use the process of sequential measurement of operational parameters of LED lighting according to claim 1.

11. Public lighting systems or industrial and building lighting that use LED lighting fixtures are characterized in that they use the process of sequential measurement of operational parameters of LED lighting according to claim 2.

12. Public lighting systems or industrial and building lighting that use LED lighting fixtures are characterized in that they use the process of sequential measurement of operational parameters of LED lighting according to claim 3.

13. Public lighting systems or industrial and building lighting that use LED lighting fixtures are characterized in that they use the process of sequential measurement of operational parameters of LED lighting according to claim 4.

14. Public lighting systems or industrial and building lighting that use LED lighting fixtures are characterized in that they use the process of sequential measurement of operational parameters of LED lighting according to claim 5.

15. Public lighting systems or industrial and building lighting that use LED lighting fixtures are characterized in that they use the process of sequential measurement of operational parameters of LED lighting according to claim 6.

16. Public lighting systems or industrial and building lighting that use LED lighting fixtures are characterized in that they use the process of sequential measurement of operational parameters of LED lighting according to claim 7.

17. Public lighting systems or industrial and building lighting that use LED lighting fixtures are characterized in that they use the process of sequential measurement of operational parameters of LED lighting according to claim 8.

18. Public lighting systems or industrial and building lighting that use LED lighting fixtures are characterized in that they use the process of sequential measurement of operational parameters of LED lighting according to claim 9.

* * * * *